United States Patent
Chen et al.

(10) Patent No.: US 10,403,596 B2
(45) Date of Patent: Sep. 3, 2019

(54) METHOD OF FABRICATING PACKAGING STRUCTURE

(71) Applicant: Siliconware Precision Industries Co., Ltd., Taichung (TW)

(72) Inventors: Hsien-Wen Chen, Taichung (TW); Shih-Ching Chen, Taichung (TW); Chieh-Lung Lai, Taichung (TW)

(73) Assignee: Siliconware Precision Indsutries Co., Ltd., Taichung (TW)

( * ) Notice: Subject to any disclaimer, the term of this patent is extended or adjusted under 35 U.S.C. 154(b) by 0 days.

(21) Appl. No.: 15/949,847

(22) Filed: Apr. 10, 2018

(65) Prior Publication Data

US 2018/0233478 A1  Aug. 16, 2018

Related U.S. Application Data

(62) Division of application No. 14/817,238, filed on Aug. 4, 2015, now abandoned.

(30) Foreign Application Priority Data

Dec. 4, 2014 (TW) .............................. 103142115 A

(51) Int. Cl.
 *H01L 21/48* (2006.01)
 *H01L 23/00* (2006.01)
 (Continued)

(52) U.S. Cl.
 CPC ............ *H01L 24/81* (2013.01); *H01L 21/486* (2013.01); *H01L 21/6835* (2013.01);
 (Continued)

(58) Field of Classification Search
 CPC ......... H01L 23/00; H01L 23/31; H01L 21/48; H01L 21/56; H01L 21/683; H01L 21/486;
 (Continued)

(56) References Cited

U.S. PATENT DOCUMENTS 7,927,999 B2 * 4/2011 Kurita .................. H01L 21/563
438/622
2003/0019663 A1 1/2003 Shigi et al.
(Continued)

*Primary Examiner* — Chuong A Luu
(74) *Attorney, Agent, or Firm* — Mintz Leving Cohn Ferris Glovsky and Popeo, P.C.; Peter F. Corless; Steven M. Jensen

(57) ABSTRACT

A package structure includes a dielectric layer having opposing first and second surfaces, a wiring layer formed on the first surface and having a plurality of conducive vias that penetrate the dielectric layer, an electronic component disposed on the first surface of the dielectric layer and electrically connected to the wiring layer, an encapsulant encapsulating the electronic component, and a packaging substrate disposed on the second surface and electrically connected to the conductive vias. With the dielectric layer in replacement of a conventional silicon board and the wiring layer as a signal transmission medium between the electronic component and the packaging substrate, the package structure does not need through-silicon vias. Therefore, the package structure has a simple fabrication process and a low fabrication cost. The present invention further provides a method of fabricating the package structure.

9 Claims, 4 Drawing Sheets

(51) Int. Cl.
*H01L 23/498* (2006.01)
*H01L 21/683* (2006.01)
*H01L 23/31* (2006.01)
*H01L 21/56* (2006.01)
*H01L 23/15* (2006.01)

(52) U.S. Cl.
CPC ...... *H01L 23/49827* (2013.01); *H01L 21/568* (2013.01); *H01L 23/15* (2013.01); *H01L 23/3128* (2013.01); *H01L 23/49811* (2013.01); *H01L 24/13* (2013.01); *H01L 24/16* (2013.01); *H01L 24/83* (2013.01); *H01L 24/97* (2013.01); *H01L 2221/68345* (2013.01); *H01L 2221/68381* (2013.01); *H01L 2224/13022* (2013.01); *H01L 2224/13147* (2013.01); *H01L 2224/16238* (2013.01); *H01L 2224/73204* (2013.01); *H01L 2224/81* (2013.01); *H01L 2224/81193* (2013.01); *H01L 2224/83104* (2013.01); *H01L 2224/92125* (2013.01); *H01L 2224/97* (2013.01); *H01L 2924/15311* (2013.01)

(58) Field of Classification Search
CPC ............... H01L 21/4853; H01L 23/498; H01L 23/49838; H01L 23/3107; H01L 23/49827; H01L 21/4803; H01L 21/481; H01L 21/58; H01L 24/00; H01L 24/10; H01L 24/03; H01L 24/11; H01L 24/27; H01L 24/28; H01L 24/31; H01L 24/35; H01L 24/64; H01L 24/81; H01L 24/16; H01L 24/13; H01L 24/83; H01L 24/97
USPC .......................... 257/774; 438/106, 126, 127
See application file for complete search history.

(56) References Cited

U.S. PATENT DOCUMENTS

| | | |
|---|---|---|
| 2003/0030134 A1 | 2/2003 | Tao |
| 2004/0094841 A1 | 5/2004 | Matsuzaki et al. |
| 2005/0247665 A1* | 11/2005 | Oi ....................... H01L 21/4857 216/13 |
| 2009/0008765 A1* | 1/2009 | Yamano .................. H01L 24/83 257/690 |
| 2015/0097277 A1 | 4/2015 | Chen et al. |

* cited by examiner

US 10,403,596 B2

METHOD OF FABRICATING PACKAGING STRUCTURE

CROSS-REFERENCE TO RELATED APPLICATION(S)

This application is a divisional of copending application U.S. Ser. No. 14/817,238, filed on Aug. 4, 2015, which claims under 35 U.S.C. § 119(a) the benefit of Taiwanese Application No. 103142115, filed Dec. 4, 2014, the entire contents of which are incorporated herein by reference.

BACKGROUND OF THE INVENTION

1. Field of the Invention

The present invention relates to package structures, and, more particularly, to a package structure with a reduced fabricating cost and a method of fabricating the package structure.

2. Description of Related Art

As the electronic industry is rapidly advancing, electronic products have been trended to have multi-functionality and high performance. The technology that is widely employed in the packaging field includes, for instance, a flip chip type package such as chip scale package (CSP), direct chip attached (DCA) or multi-chip Module (MCM) or 3D chip stacking type package (3D IC).

FIGS. 1A-1F are schematic views showing a method of fabricating a conventional 3D chip stacking type package structure 1.

As shown in FIG. 1A, a silicon board 10 having a switching side 10b and an opposing chip mounting side 10a is provided. A plurality of openings 100 are formed on the chip mounting side 10a of the silicon board 10.

As shown in FIG. 1B, the openings 100 are filled with an insulating material 102 and a conductive material (such as a copper material) to form through-silicon vias (TSV) 101, and a redistribution layer (RDL) is formed on the chip mounting side 10a and electrically connected with the TSVs 101.

The redistribution layer is formed by: forming a dielectric layer 11 on the chip mounting side 10a; forming on the dielectric layer 11 a wiring layer 12 that has a plurality of conductive vias 120 formed in the dielectric layer 11 and electrically connected with the TSVs 101; forming an insulating protection layer 13 on the dielectric layer 11 and the wiring layer 12, with a portion of the wiring layer 11 exposed from the insulating protection layer 13; and forming a plurality of first conductive elements 14 such as solder bumps on the exposed portion of the wiring layer 12.

As shown in FIG. 1C, a portion of the switching side 10b is grinded, such that the end surfaces of the TSVs 101 are exposed from the switching side 10b'.

As shown in FIG. 1D, an insulating protection layer 15 is formed on the switching side 10b', with the end surfaces of the TSVs 101 exposed, a plurality of second conductive elements 16 are coupled onto the end surfaces of the TSVs 101 and electrically connected with the TSVs 101, and comprise solder materials or copper bumps, or under bump metallurgy (UBM) 160 optionally.

As shown in FIG. 1E, a singulation process is performed along a cutting line S as shown in FIG. 1D, to obtain a plurality of through silicon interposers (Through Silicon interposer, TSI) 1a, at least one of which is mounted on a packaging substrate 19 via the second conductive elements 16. The packaging substrate 19 is electrically connected with the TSVs 101, and coupled to the second conductive elements 16 through the electrical connection pads 190 with larger spacing in between. The second conductive elements 16 are electrically connected with the TSVs 101. An underfill 191 is formed and encapsulates the second conductive elements 16.

As shown in FIG. 1F, a plurality of electronic component 17 having electrode pads with smaller spacing on the first conductive elements 14 is formed. The electronic component 17 are electrically connected with the wiring layer 12 and coupled with the first conductive elements 14 by a flip-chip method. An underfill 171 is formed and encapsulates the first conductive elements 14.

An encapsulant 18 is formed on the packaging substrate 19 and encapsulates the electronic component 17 and the through silicon interposer 1a.

A plurality of solder balls 192 are formed on the bottom side of the packaging substrate 19, for an electronic device such as a printed circuit board to be mounted thereon.

However, in the method of fabricating the conventional package structure 1, the through silicon interposer 1a serves as a signal transmission medium between the electronic component 17 and the packaging substrate 19, and a certain ratio between the depth and width must be kept (i.e., the depth/width ration of the TSVs 101) to fabricate a suitable through silicon interposer 1a, such that both the complexity and fabrication cost are undesirably increased.

Further, the carrier used during the fabricating process (not shown) are all silicon boards, and are all removed through a mechanical means. Therefore, it is easy to cause damages to the silicon boards, such that they could no longer be used once being damaged, thereby causing more consumed materials.

Thus, there is an urgent need for solving the foregoing problems.

SUMMARY OF THE INVENTION

In view of the foregoing drawbacks of the prior art, the present invention provides a package structure, comprising: a dielectric layer having opposing first and second surfaces; a wiring layer formed on the first surface of the dielectric layer and having a plurality of conductive vias penetrating the dielectric layer; at least one electronic element formed on the first surface of the dielectric layer and electrically connected with the wiring layer; an encapsulant formed on the wiring layer and the first surface of the dielectric layer and encapsulating the electronic component; and a packaging substrate formed on the second surface of the dielectric layer and electrically connected with the conductive vias.

The present invention also provides a method of fabricating a package structure, comprising: forming on a carrier a dielectric layer that has a first surface and a second surface opposing the first surface and coupled to the carrier; forming on the first surface of the dielectric layer an wiring layer that has a plurality of conductive vias formed in the dielectric layer and coupled with the second surface of the dielectric layer; removing the carrier, with end surfaces of the conductive vias exposed from the second surface of the dielectric layer; forming on the first surface of the dielectric layer at least one electronic element electrically connected with the wiring layer; forming on the wiring layer and the first surface of the dielectric layer an encapsulant that encapsulates the electronic component; and forming on the second surface of the dielectric layer a packaging substrate that is electrically connected with the conductive vias.

In an embodiment, the end surfaces of the conductive vias are flush with the second surface of the dielectric layer.

In an embodiment, the electronic component is an active component, a passive component, or a combination thereof.

In an embodiment, the package structure further comprises a plurality of first conductive elements disposed on the wiring layer and coupled with the electronic component.

In an embodiment, the package structure further comprises, before the first conductive elements is formed, an insulating protection layer is formed on the first surface of the dielectric layer and the wiring layer, with a portion of the wiring layer exposed from the insulating protection layer.

In an embodiment, the method further comprises forming second conductive elements on the end surfaces of the conductive vias, for coupling the packaging substrate onto the first conductive elements.

In an embodiment, the package structure further comprises, before the second conductive elements are formed, an insulating protection layer is formed on the second surface of the dielectric layer and the end surfaces of the conductive vias, with the end surfaces of the conductive vias exposed from the insulating protection layer.

In summary, the package structure the method of fabricating the same according to the present invention are characterized by replacing the conventional silicon board with a dielectric layer and forming a wiring layer that serves as a signal transmission medium between the electronic component and packaging substrate. Therefore, there is no need to fabricating conventional type of TSVs, thereby greatly reducing the complexity and cost of the fabrication.

DETAILED DESCRIPTION OF THE PREFERRED EMBODIMENTS

The present invention is described in the following with specific embodiments, so that one skilled in the pertinent art can easily understand other advantages and effects of the present invention from the disclosure of the present invention.

It should be noted that all the drawings are not intended to limit the present invention. Various modification and variations can be made without departing from the spirit of the present invention. Further, terms, such as "top", "first", "second" and "one" are merely for illustrative purpose and should not be construed to limit the scope of the present invention.

FIGS. 2A-2G are schematic cross-sectional views showing a method of fabricating a package structure 2 according to the present invention.

Figure 1A:
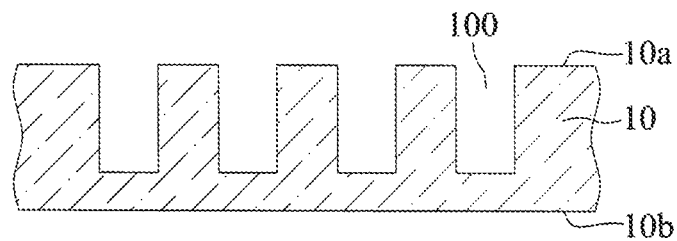
FIGS. 1A-1F are schematic cross-sectional views showing a method of fabricating a conventional package structure.
Figure 1B:
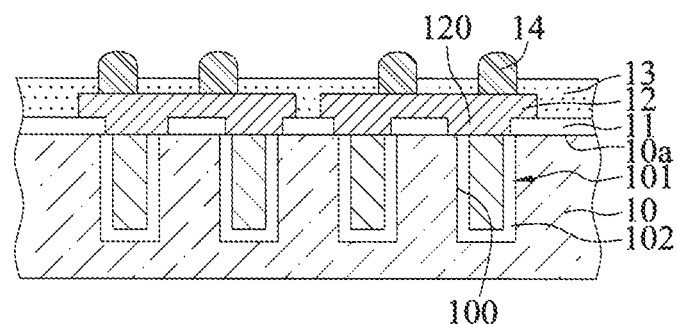
Figure 1C:
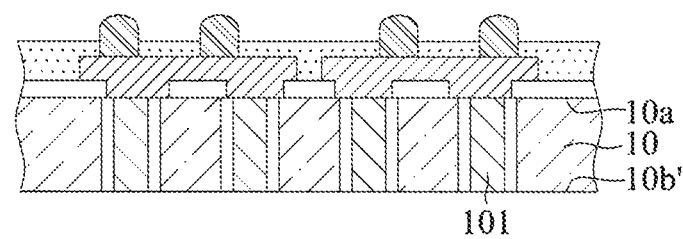
Figure 1D:
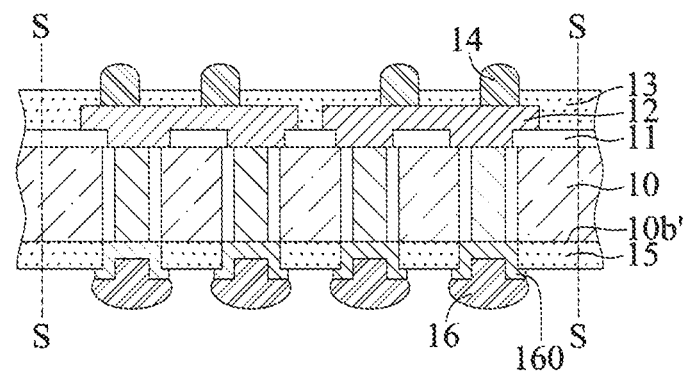
Figure 1E:
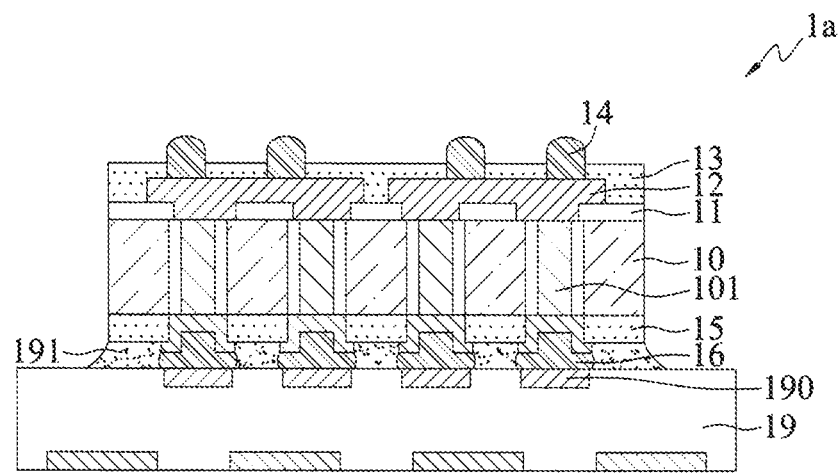
Figure 1F:
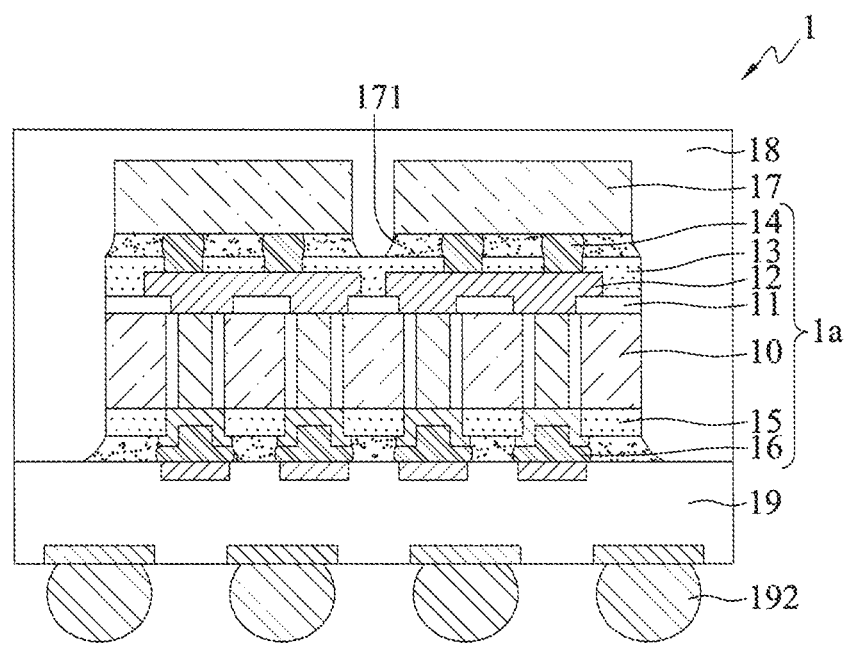
Figure 2A:
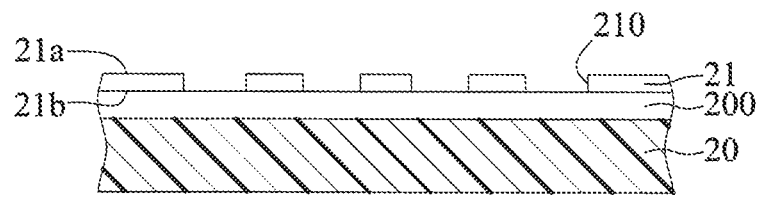
FIGS. 2A-2G are schematic cross-sectional views showing a method of fabricating a package structure according to the present invention.

As shown in FIG. 2A, a dielectric layer 21 having a first surface 21a and an opposing second surface 21b is formed on and coupled to a carrier 20 via the second surface 21b.

In an embodiment, the carrier 20 is a glass board and has a bonding layer 200, such as an adhesive or a releasing mold, that couples to the second surface 21b of the dielectric layer 21.

Further, the dielectric layer 21 is made of a photo imageable dielectric (PID) or a polyimide (PI).

Furthermore, the dielectric layer 21 has a plurality of vias 210 penetrating the first and second surfaces 21a and 21b, with a portion the carrier 20 exposed from the bonding layer.

In an embodiment, the first surface 21a of the dielectric layer 21 serves as a chip mounting side, while the second surface 21b of the dielectric layer 21 serves as a switching side.

Figure 2B:
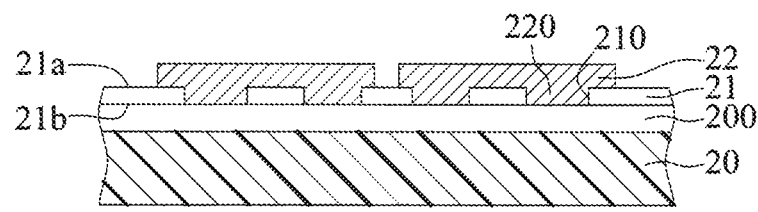

As shown in FIG. 2B, a plating method with copper is employed to form a wiring layer 22 on the first surface 21a of the dielectric layer 21, and the wiring layer 22 has a plurality of conductive vias 220 formed in the vias 210 and coupled to the second surface 21b of the dielectric layer 21.

Figure 2C:
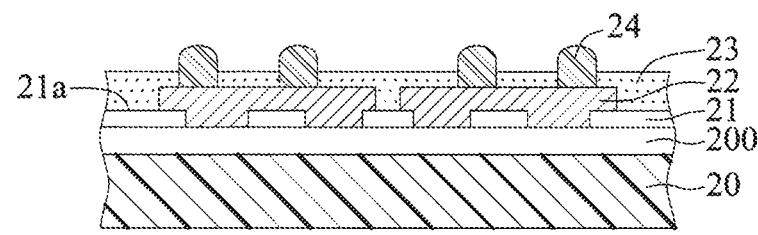

As shown in FIG. 2C, a plurality of first conductive elements 24 such as conductive bumps are formed on the wiring layer 22.

In an embodiment, an insulating protection layer 23 is formed on the first surface 21a of the dielectric layer 21 and the wiring layer 22, with a portion of the wiring layer 21 exposed from the insulating protection layer 23, and the first conductive elements 24 are formed on the exposed portion of the wiring layer 22.

Further, the first conductive elements 24 comprise solder materials or copper bumps, and may selectively comprise an under bump metallurgy (UBM).

Figure 2D:
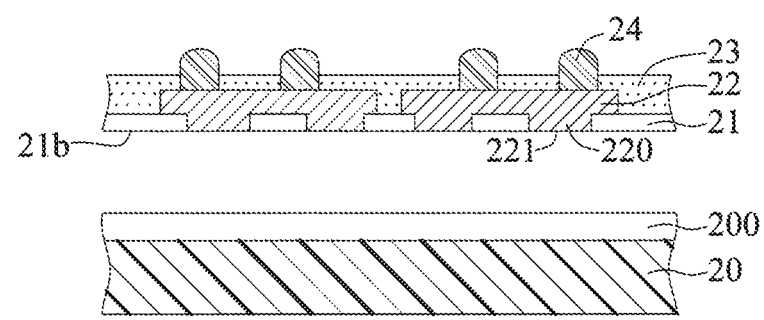

As shown in FIG. 2D, the carrier 20 and the bonding layer 200 are removed, such that the end surfaces 221 of the conductive vias 220 are exposed from the second surface 21b of the dielectric layer 21.

In an embodiment, a laser process is employed to penetrate the carrier 20 and remove the bonding layer 200, so as to separate the carrier 20 and the dielectric layer 21. The bonding layer 200 is directly peeling off if it is a releasing mold. Further, the end surfaces 221 of the conductive vias 220 are flush with the second surface 21b of the dielectric layer 21.

Figure 2E:
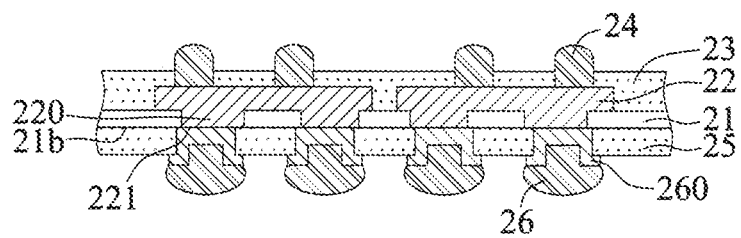

As shown in FIG. 2E, a plurality of second conductive elements 26 such as conductive bumps are formed on the end surfaces 221 of the conductive vias 220.

In an embodiment, an insulating protection layer 25 is formed on the second surface 21b of the dielectric layer 21 and the end surfaces 221 of the conductive vias 220, with the end surfaces 221 of the conductive vias 220 exposed, and the second conductive elements 26 are formed the ends 221 of the conductive vias 220.

In an embodiment, the second conductive elements 26 comprise solder materials or copper bumps, and may selectively comprise an under bump metallurgy (UBM) 260.

Figure 2F:
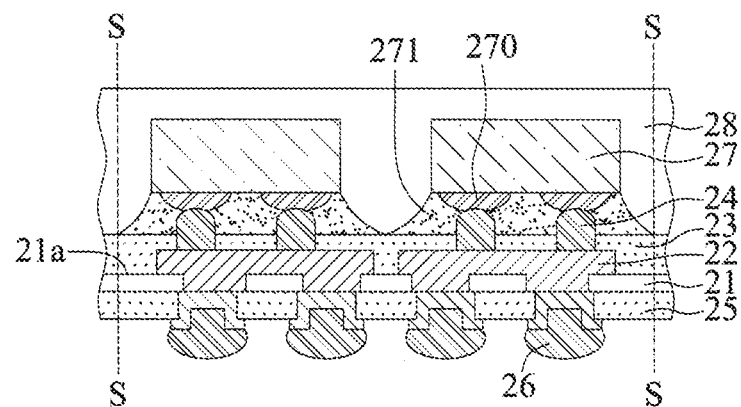

As shown in FIG. 2F, a plurality of electronic components 27 are formed on the first conductive elements 24 on the first surface 21a of the dielectric layer 21, and electrically connected with the wiring layer 21. Subsequently, an encapsulant 28 is formed on the wiring layer 21 and on the first surface 21a of the dielectric layer 21, and encapsulates the electronic component 27.

In an embodiment, the electronic component 27 is an active component, a passive component, or a combination thereof. In another embodiment, the active component is a semiconductor chip, and the passive component is a resistor, a capacitor, or an inductors. Further, the electronic component 27 is coupled to the first conductive elements 24 via the conductive bumps 270, and an underfill 271 is then formed and encapsulates the conductive bumps 270 and the first conductive elements 24.

Figure 2G:
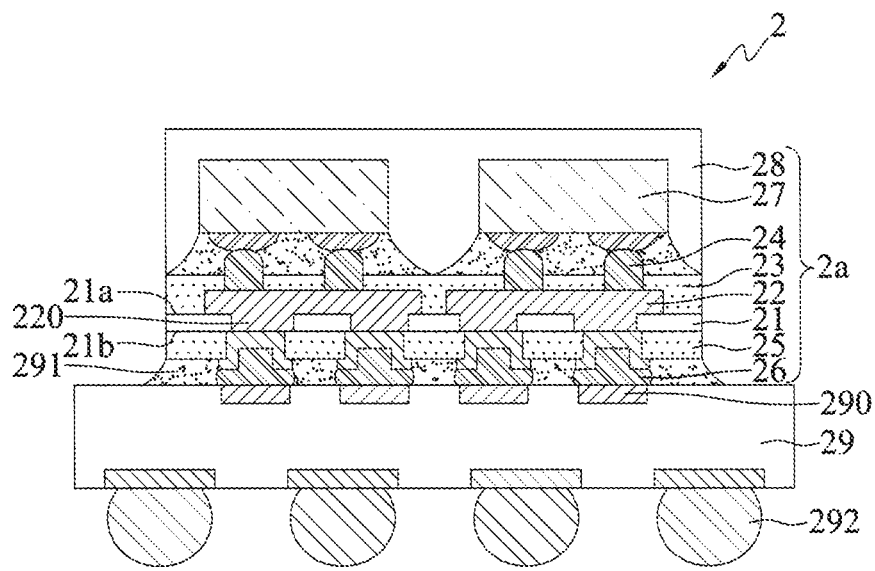

As shown in FIG. 2G, a singulation process is performed along the cutting path S shown in FIG. 2F, to obtain a plurality of packages 2a, and then at least one package 2a is formed on a packaging substrate 29 via the second conductive elements 26. The packaging substrate 29 is electrically connected with the conductive vias 220. Subsequently, a plurality of solder balls 292 are formed on the bottom surface of the packaging substrate 29, for an electronic device such as a printed circuit board to be mounted thereon.

In an embodiment, the packaging substrate 29 is coupled to the second conductive elements 26 via a plurality of electrical connection pads 290, and then an underfill 291 is formed to encapsulate the second conductive elements 26.

In a method of fabricating a package structure according to the present invention, the dielectric layer 21 made of a photo imageable dielectric material or a polyimide (PI) replaces the conventional silicon board, and the wiring layer 22 is used as a signal transmission medium between the electronic component 27 and the packaging substrate 29. Therefore, there is no need for fabricating conventional TSVs, and the complexity and fabrication cost are greatly reduced.

Further, the carrier 20 used in the method according to the present invention is a glass board, and can be removed by a laser method penetrating the glass board for burning off the bonding layer 200. As a result, the carrier 20 is not damaged and can be repeatedly used, thereby reducing the fabrication cost.

In an embodiment, the steps of the method according to the present invention can be modified according to practical needs. For example, after the first conductive elements 24 is formed (FIG. 2C), it is applicable to disposing the electronic component 27 on the first conductive elements 24 first, then removing the carrier 20 and the bonding layer 200 thereof, and fabricating the second conductive elements 26.

The present invention provides a package structure 2, comprising: a dielectric layer 21, a wiring layer 22, a plurality of electronic component 27, an encapsulant 28, and a packaging substrate 29.

The dielectric layer 21 has a first surface 21a and an opposing second surface 21b.

The wiring layer 22 is formed on the first surface 21a of the dielectric layer 21, and the wiring layer 22 has a plurality of conductive vias 220 penetrating the dielectric layer 21.

The electronic component 27 is formed on the first surface 21a of the dielectric layer 21 and electrically connected with the wiring layer 22.

The encapsulant 28 is formed on the wiring layer 22 and the first surface 21a of the dielectric layer 21 and encapsulates the electronic component 27.

The packaging substrate 29 is formed on the second surface 21b of the dielectric layer 21 and electrically connected with the conductive vias 220.

In an embodiment, the end surfaces 221 of the conductive vias 220 are flush with the second surface 21b of the dielectric layer 21.

In an embodiment, the electronic component 27 is an active component, a passive component, or a combination thereof.

In an embodiment, the package structure 2 further comprises a plurality of first conductive elements 24 formed on the wiring layer 22 and coupled with the electronic component 27.

In an embodiment, the package structure 2 further comprises an insulating protection layer 23 formed on the first surface 21a of the dielectric layer 21 and on the wiring layer 22, with a portion of the wiring layer 22 exposed from the insulating protection layer 23.

In an embodiment, the package structure 2 further comprises a plurality of second conductive elements 26 formed on the end surfaces 221 of the conductive vias 220 and coupled with the packaging substrate 29.

In an embodiment, the package structure 2 further comprises an insulating protection layer 25 formed on the second surface 21b of the dielectric layer 21, with the end surfaces of the conductive vias 220 exposed from the insulating protection layer 25.

In summary, the package structure the method of fabricating the same according to the present invention are characterized by replacing the conventional silicon board with a dielectric layer and forming a wiring layer to serve as a signal transmission medium between the electronic component and packaging substrate. Therefore, such that there is no need to fabricating conventional type of TSVs, and the complexity and fabrication cost are greatly reduced.

Further, the carrier used in the method according to the present invention is a glass board, and can be removed by a laser method. As a result, the carrier is not damaged and can be repeatedly used, thereby reducing the fabrication cost.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of fabricating a package structure, comprising:
    forming on a carrier a dielectric layer that has a first surface and a second surface opposing the first surface and coupled to the carrier;
    forming on the first surface of the dielectric layer a wiring layer that has a plurality of conductive vias formed in the dielectric layer and coupled with the second surface of the dielectric layer;
    removing the carrier, with end surfaces of the conductive vias exposed from the second surface of the dielectric layer;
    after removing the carrier, forming on the first surface of the dielectric layer at least one electronic component electrically connected with the wiring layer;
    forming on the wiring layer and the first surface of the dielectric layer an encapsulant that encapsulates the electronic component; and
    forming on the second surface of the dielectric layer a packaging substrate that is electrically connected with the conductive vias.

2. The method of claim 1, wherein the end surfaces of the conductive vias are flush with the second surface of the dielectric layer.

3. The method of claim 1, wherein the electronic component is an active component, a passive component, or a combination thereof.

4. The method of claim 1, further comprising forming on the wiring layer a plurality of first conductive elements coupled to the electronic component.

5. The method of claim 1, further comprising forming an insulating protection layer on the first surface of the dielectric layer and the wiring layer, with a portion of the wiring layer exposed from the insulating protection layer.

6. The method of claim 1, further comprising forming on the end surfaces of the conductive vias second conductive elements that are coupled to the packaging substrate.

7. The method of claim 1, further comprising forming an insulating protection layer on the second surface of the dielectric layer and on the end surfaces of the conductive vias, with the end surfaces of the conductive vias exposed from the insulating protection layer.

8. The method of claim 1, wherein the carrier is a glass board.

9. The method of claim 1, wherein the dielectric layer is made of a photo imageable dielectric.

\* \* \* \* \*